(12) United States Patent
Cummings

(10) Patent No.: US 9,788,215 B2
(45) Date of Patent: Oct. 10, 2017

(54) COLLABORATIVE COMPUTING AND ELECTRONIC RECORDS

(75) Inventor: Mark Cummings, Atherton, CA (US)

(73) Assignee: Mark Cummings, Atherton, CA (US)

(*) Notice: Subject to any disclaimer, the term of this patent is extended or adjusted under 35 U.S.C. 154(b) by 0 days.

(21) Appl. No.: 13/290,767

(22) Filed: Nov. 7, 2011

(65) Prior Publication Data

US 2012/0117158 A1 May 10, 2012

Related U.S. Application Data

(60) Provisional application No. 61/456,385, filed on Nov. 5, 2010.

(51) Int. Cl.
*H04W 24/02* (2009.01)
*G06F 9/44* (2006.01)
*H04W 8/22* (2009.01)
*G06F 17/50* (2006.01)
*H04W 28/02* (2009.01)
*H04W 48/16* (2009.01)
*H04W 24/00* (2009.01)

(52) U.S. Cl.
CPC ........... *H04W 24/02* (2013.01); *G06F 9/4411* (2013.01); *G06F 17/505* (2013.01); *H04W 8/22* (2013.01); *H04W 28/0215* (2013.01); *H04W 48/16* (2013.01); *H04W 24/00* (2013.01)

(58) Field of Classification Search
CPC ......... H04L 67/02; H04L 67/16; H04L 67/42; G06Q 50/24; G06F 19/322; G06F 19/3443; G06F 17/30575
See application file for complete search history.

(56) References Cited

U.S. PATENT DOCUMENTS 5,751,909 A * 5/1998 Gower ............. G06F 17/30607
706/45
5,970,490 A * 10/1999 Morgenstern ..... G06F 17/30569
6,438,594 B1 * 8/2002 Bowman-Amuah ......................
G06F 9/4428
709/203

(Continued)

FOREIGN PATENT DOCUMENTS

CN 1762130 A 4/2006
CN 101013957 8/2007
CN 101616007 A 12/2009

OTHER PUBLICATIONS

Lawton, G. New Protocol Improves Interaction among Networked Devices and Applications. Computing Now [online], Jul. 2010 [retrieved on Feb. 23, 2012]. Retrieved from the Internet: <URL: http//www.computer.org/portal/web/computingnow/archive/news065>.

(Continued)

*Primary Examiner* — Hadi Armouche
*Assistant Examiner* — Christopher C Harris
(74) *Attorney, Agent, or Firm* — Van Pelt, Yi & James LLP

(57) ABSTRACT

Collaborative computing and electronic records are disclosed. An entity that may be able to help achieve an objective is discovered and a connection to the entity established. A meta-language is used to exchange with the entity a description of the objective and a description of the entity. The meta-language is used to negotiate with the entity a contract to help achieve the objective. In the event a contract to help achieve the objective is reached, performing a self-configuration in accordance with the contract.

24 Claims, 11 Drawing Sheets

(56) References Cited

U.S. PATENT DOCUMENTS

| | | | |
|---|---|---|---|
| 6,618,805 | B1 | 9/2003 | Kampe |
| 6,976,160 | B1 | 12/2005 | Yin et al. |
| 8,291,468 | B1 | 10/2012 | Chickering |
| 8,775,218 | B2* | 7/2014 | Burgoon, Jr. .......... G06Q 50/22 705/4 |
| 2003/0074443 | A1 | 4/2003 | Melaku et al. |
| 2004/0111590 | A1 | 6/2004 | Klein, Jr. |
| 2004/0203385 | A1 | 10/2004 | Narayanan et al. |
| 2004/0267965 | A1 | 12/2004 | Vasudevan |
| 2005/0055196 | A1 | 3/2005 | Cohen et al. |
| 2005/0157660 | A1 | 7/2005 | Mandato et al. |
| 2005/0203892 | A1* | 9/2005 | Wesley ............... H04L 67/2838 |
| 2005/0251501 | A1* | 11/2005 | Phillips et al. .................... 707/2 |
| 2006/0190904 | A1 | 8/2006 | Haji-Aghajani et al. |
| 2007/0055552 | A1* | 3/2007 | St. Clair et al. ................... 705/3 |
| 2007/0130208 | A1 | 6/2007 | Bornhoevd et al. |
| 2007/0283317 | A1* | 12/2007 | Sadler ..................... G06F 9/465 717/103 |
| 2008/0046292 | A1* | 2/2008 | Myers ............... G06F 17/30557 705/3 |
| 2008/0062871 | A1 | 3/2008 | Grayson |
| 2008/0068989 | A1 | 3/2008 | Wyk et al. |
| 2009/0070728 | A1 | 3/2009 | Solomon |
| 2009/0080408 | A1* | 3/2009 | Natoli .................... G06F 19/322 370/351 |
| 2009/0100178 | A1 | 4/2009 | Gonzales |
| 2010/0014533 | A1 | 1/2010 | Hirano et al. |
| 2010/0063930 | A1* | 3/2010 | Kenedy et al. ................. 705/51 |
| 2010/0125664 | A1* | 5/2010 | Hadar et al. ................... 709/224 |
| 2010/0191765 | A1 | 7/2010 | Gan et al. |
| 2010/0192120 | A1 | 7/2010 | Raleigh |
| 2010/0202391 | A1 | 8/2010 | Palanki |
| 2011/0016214 | A1* | 1/2011 | Jackson ........................ 709/226 |
| 2011/0116480 | A1 | 5/2011 | Li |
| 2011/0137805 | A1* | 6/2011 | Brookbanks et al. .......... 705/80 |
| 2011/0138060 | A1 | 6/2011 | Purkayastha et al. |
| 2011/0145153 | A1* | 6/2011 | Dawson et al. ................ 705/80 |
| 2011/0145209 | A1 | 6/2011 | Kahn et al. |
| 2011/0153854 | A1* | 6/2011 | Chickering ......... H04L 63/0815 709/229 |
| 2011/0246236 | A1* | 10/2011 | Green et al. ....................... 705/3 |
| 2011/0276713 | A1* | 11/2011 | Brand ............................. 709/232 |
| 2012/0096525 | A1* | 4/2012 | Bolgert ............... G06F 11/3065 726/6 |
| 2012/0116782 | A1* | 5/2012 | Punnoose et al. ............. 705/1.1 |
| 2012/0239685 | A1 | 9/2012 | Kahn et al. |
| 2013/0237182 | A1 | 9/2013 | Schlager |

OTHER PUBLICATIONS

Visarius et al. "Generic Integration infrastructure for IP-based design processes and tools with a unified XML format".Integration, the VLSI Journal—Special issue: IP and design reuse, vol. 37, Issue 4. Published Sep. 2004 [online] Retrieved from the Internet <URL:http://www.sciencedirect.com/science/article/pii/S016792600400033>.

"Wagner et al. "Strategies for the integration of hardware and software IP components in embedded systems-on-chip". In Integration, the VLSI Journal, vol. 37. Published Sep. 2004 [online] Retrieved from the Internet <URLhttp://www.sciencedirect.com/science/article/pii/S0167926003001 093>".

Wirthlin et al. "OpenFPGA CoreLib core library interoperability effort". In Journal of Parallel Computing, vol. 34, issue 4-5 [online]. Published May 2008. [retrieved on Mar. 8, 2012] Retrieved from the Internet <URL:http://ce-serv.et.tudelft.nl/publicationfiles/1605_1002_OpenFPGA.pdf>.

Wirthlin et al "Future Field Programmable Gate Array (FPGA) Design Methodologies and Tool Flows". Report AFRL-RY-WP-TR-2008-1228 of the Air Force Research Laboratory [online]. Published Jul. 2008. [retrieved on Mar. 8, 2012] Retrieved from the Internet <URL:http://www.dtic.mil/cgi-bin/GetTRDoc?AD=ADA492273&Location=U2&doc=GetTRDoc.pdf>.

Software Defined Radio Forum. SDR Forum. Use Cases for MLM Language in Modem Wireless Networks. SDRF-08-P-0009-V1.0.0. Jan. 28, 2009.

Cummings et al. Changing Metalanguage Landscape. Proceedings of the SDR '09 Technical Conference and Product Exposition, Copyright (c) 2009 SDR Form, Inc.

Mark Cummings. Alternatives for Coexistence Mechanisms in White Space. doc.: IEEE 802.19-09/0044r0. Jul. 7, 2009.

Matthew Sherman. TV Whitespace Tutorial Intro. IEEE 802 Executive Committee Study Group on TV White Spaces. Mar. 10, 2009.

Google Inc. Authorized Ex Parte Contract—Unlicensed Operation in the TV Broadcast Bands (ET Docket No. 04-186). Apr. 10, 2009. SDR Conference 2009. V1 4.

Cummings et al. ECSG Adhoc Use Case Tutorial. IEEE 802 Executive Commitee Study Group on TV White Spaces—Adhoc Use Case Sub-Group. Jan. 20, 2009.

Kokar et al. Towards a Unified Policy Language for Future Communication Networks: A Process. DYSPAN Conference, Chicago Oct. 2008.

Cooklev et al. Networking Description Language for Ubiquitous Cognitive Networking. SDR Technical Conference, Washington, DC, Oct. 2008.

Cummings et al. Activities of SDR Forum MLM Working Group on a Language for Advanced Communication Systems Applications. SDR Technical Conference, Washington, DC, Oct. 2008.

Fette et al Next-Generation Design Issued in Communications. Portable Design. Mar. 2008.

Cummings et al. IEEE 802.21: The Leading Edge of a Larger Challenge. 2008.

Cummings et al. en Via. Commercial Wireless Metalanguage Scenario. SDR Technical Conference, Denver, CO. Nov. 2007.

Cummings et al. Via Commercial Wireless Metalanguage Scenario. SDR Technical Conference. 2007.

Cummings et al. en Via. The Role of a Metalanguage in the Context of Cognitive Radio Lifecycle Support. SDR Technical Conference. Orlando, Nov. 16, 2006.

Cummings et al. The Role of a Metalanguage in the Context of Cognitive Radio Lifecycle Support. SDR Technical Conference. 2006.

Mark Cummings. IEEE P802.19 Wireless Coexistence. Directions to a TV White Space Coexistence Mechanisms Par. Aug. 17, 2009.

Kokar et al. Towards a Unified Policy Language for Future Communication Networks: A Process. DySpan. NDL v10. 2008.

Cummings et al. Commercial Wireless Metalanguage Scenario. SDR Technical Conference. v13.2007.

Subrahmanyam et al. Perspectives on a Metalanguage for Configurable Wireless Systems. SDR Technical Conference. 2004.

Mark Cummings. en Via II SDR Forum: Commercial SDR Initiative. GSPx, Sep. 30, 2004.

Mark Cummings. en Via II Managing Complexity as Networks Evolve. Future Wireless Workshop. SDR Form. Seoul, South Korea. Sep. 13, 2004.

Patrick Mannion. Cognitive Radio Hailed as Next Big Thing: in Wireless. EE Times. Aug. 23, 2004.

Mark Cummings. Creating a New Wireless World. EE Times. Aug. 23, 2004.

Mark Cummings. Commercial SDR Drivers & Status SDR Forum Technical Plenary. RFco Semiconductor. Toronto. Jun. 15, 2004.

Mark Cummings. System of Systems Joint E2R / SDR Forum Workshop. RFco Semiconductor. Mainz. Apr. 20, 2004.

Mark Cummings. Vision, Trend and Challenges of SDR. RFco. ITU Workshop. Geneva. Dec. 3, 2003.

Mark Cummings. Status and Future Directions of Technology for Software Defined Radios and Implications for Regulators. Symposium on Download Security and Regulatory Issues. RFco. Tokyo. Apr. 14, 2003.

IEE Standard for IP-XACT, Standard Structure for Packaging, Integrating, and Reusing IP within Tool Flows. IEEE Computer Society and the IEE Standards Association Corporate Advisory Group. Sponsored by the Design Automation Standards Committee. Feb. 18, 2010.

(56) References Cited

OTHER PUBLICATIONS

AMBA Design Kit. Revision: r3p0. Technical Reference Manual. ARM DDI 0243C. Copyright (c) 2003, 2007.
AMBA Designer ADR-400. Revision: r3p1. User Guide ARM DUI 0333K. Copyright (c) 2006-2010, 2011 ARM.
Dave Murray. duolog technologies. Using IP-XPACT (TM) in Complex SoC i/o Integration and SoC Register Management. IP-XACT Users Group: Session 1 (in association with Texas Instruments). Jul. 8, 2008.
Anupam Bakshi. IDesignSpec (TM) Don't Fear Change, Embrace it.. Agnisys Inc. May 1, 2008.
VMM Register Abstraction Layer User Guide. Jul. 2011.
Synopsys, Inc. An Introduction to the VMM Register Abstraction Layer. SOCentral. Jul. 30, 2007.
SystemRDL V1.0: A Specification for a Register Description Language. Prepared by the Register Description Working Group of the Spirit Consortium. Mar. 24, 2009.
Accellera. Unified Power Format (UPF) Standard. Version 1.0. Feb. 22, 2007.
Paine et al. IEEE P802.19. Wireless Coexistence. WhiteSpace Coexistence Ue Cases. Jul. 2009.
Cummings et al. en Via II. Perspectives on a Meta Language for Configurable Wireless Systems. SDR Forum Technical Conference Phoenix, Nov. 2004.
Cummings et al. Changing Metalanguage Landscape. IPFW Indiana University—Purdue University Fort Wayne. SDR Conference 2009.
Trusted Computing Group, TCG Trusted Network Connect, TNC IF-MAP Binding for SOAP, Specification Version 1.1, Revision 5, May 18, 2009.

\* cited by examiner

COLLABORATIVE COMPUTING AND ELECTRONIC RECORDS

CROSS REFERENCE TO OTHER APPLICATIONS

This application claims priority to U.S. Provisional Patent Application No. 61/456,385 entitled COLLABORATIVE COMMUNICATIONS AND COMPUTING, filed Nov. 5, 2010, which is incorporated herein by reference for all purposes.

BACKGROUND OF THE INVENTION

The information technology (IT) industry is moving through an inflection point that is significantly changing IT delivery. IT users are increasingly virtualizing their data center and other computing and/or data storage resources to gain operational advantages and economic efficiency. At the same time public providers of cloud computing services have emerged to both off-load IT assets from corporations as well as provide an alternative to private ownership and management of a wide range of IT services. Cloud computing in its many forms is promising to be a viable and desirable IT delivery platform.

The cloud computing service provider segment is dominated by a few large providers. Each has a proprietary interface that is different from the others. These proprietary interfaces are also changing. These dominant cloud service providers see their proprietary interfaces as adding significant value and giving them competitive advantages. However, these proprietary interfaces have restrained the growth/adoption of cloud computing and made it less efficient.

The problem of proprietary interfaces is present in other IT domains beyond cloud computing. Other examples include, without limitation, the electronic records domain. For example, a person may have a plurality of electronic medical records maintained by separate and independent medical services providers, such as hospitals, private physicians and/or physician groups, different medical specialists, labs and other diagnostic facilities, clinics and outpatient treatment facilities, pharmacies, government health plans and/or agencies, etc. Typically, the electronic records of one healthcare organization are maintained entirely separately from those of others, making it difficult and nearly impossible for a treating physician or other health care provider to access a comprehensive view of a patient's electronic healthcare record.

BRIEF DESCRIPTION OF THE DRAWINGS

Various embodiments of the invention are disclosed in the following detailed description and the accompanying drawings.

DETAILED DESCRIPTION

Figure 1:
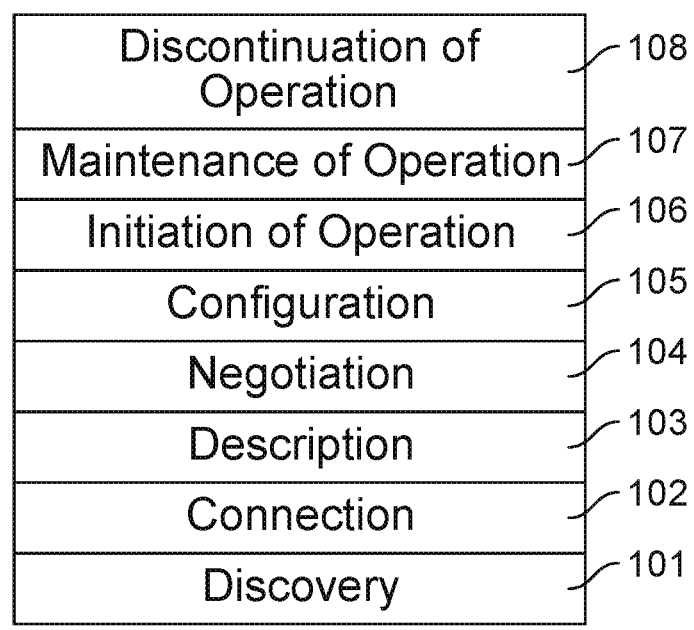
FIG. 1 illustrates an eight layer model of collaborative computing.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques disclosed herein address a problem that is a result of the convergence of two developments in information processing. The first is the penetration of electronic data processing into more and more areas of modern society and within each area increasing levels of integration. The second is virtualization creating what is commonly called 'Cloud Computing'.

Cloud computing offers users potential cost/performance benefits that have driven its rapid adoption. However, it has been limited by a set of difficulties. Different commercial cloud computing service vendors have implemented different interfaces for users to bring work to. This has resulted in users tailoring their work to meet these proprietary interfaces and thus being tied to a single provider. Providers appear to like this because it allows them to lock in customers. Providers also argue that their proprietary interfaces provide unique benefits to their customers. The flip side of this situation is that because it is difficult to move from one cloud to another:

Some users refrain from bringing work to cloud computing
  Potential benefits of back-up and redundancy are lost
  Potential benefits of peak time off load are lost
  Potential benefits of increased market efficiency are lost There are a wide variety of different kinds of work that may be performed on a cloud. One of them is the combination and integration of data from multiple sources. This integration of data, with appropriate privacy and security protections has deep and important benefits to individuals, organizations and society. This integration of data is variously referred to as comprehensive, global, data mining, mash-up, etc. It is performed with data on clouds and non-cloud resources.

Current technology creates impediments to data integration. Data stores are commonly in some form of data base. Some data is held in other forms such as comma delineated files. These non-database forms have all the problems of databases and additional difficulties. There are a variety of different DBMS's (Data Base Management Systems). There are also a variety of proprietary and standards based DBMS query systems. The problem faced by data integration is that the way different data bases are structured and the way that the same information in different data bases is represented varies greatly.

An example of this problem can be seen in current attempts to integrate electronic health records (EHR's). In the US, the national government has mandated that all health care providers implement electronic record keeping systems to replace the previously completely or partially paper based records systems. The US government is then trying to create health record interchange systems sometimes called Beacons. The intent is to provide a care-giver a comprehensive view of a patient who has been treated by a number of different administrative units. Each different administrative unit has a different way of structuring its data.

There are a number of different standards for EHR's. In addition there are implementations that predate the standards and others which only partially follow the standards. At the same time, the way data is represented in a data base may differ from administrative unit to unit. These differences are even in simple things we take for granted; for example, how to identify a patient. A married Polish woman can write her name correctly in 72 different ways. A Chinese woman married to a European man has four possible names spelled in roman characters in addition to four names in idiographic characters. Combinations and permutations of these (first name last, first name first, etc.) bring the possibilities to a couple of dozen. Numerical identification systems also suffer from the number of different ways to determine, or assign identification numbers. Another example is how to represent dates. One observer notes that there are also 273 ways of indicating a specific date.

In order to integrate data, specific types of data have to be aligned and then the actual meaning of the data has to be aligned.

The movement of work between cloud computing providers and the integration of data are described above as somewhat atomic problems. In actuality it is often the case that aspects of each are combined. Also, in some cases work doesn't move from cloud service provider to cloud service provider, but rather, different 'clouds' need to cooperate to perform work. Furthermore, in moving tasks, cooperating between Clouds and moving/integrating data; movement of communication channels, Internet Protocol (IP) addresses, or other similar communications activities may also be involved. Such movement of communication resources is included in the Configuration part of the Process described below.

The embodiments described below describe moving work from cloud to cloud and integrating data as two atomic problems to ease understanding. The invention encompasses all of this more complex landscape of cloud non-cloud, data centric, work centric, movement and cooperation aspects. From an analytic point of view, these problems can be seen as subsets of a more general problem of coordination or orchestration in large complex electronic information systems. These problems are solved today by manual effort. Manual effort can achieve reasonable results if the complexity, volatility, and scale are low. One important contributor to complexity is having a number of different organizations with a number of divergent business objectives and technology bases involved. However, as these factors increase, manual capability becomes difficult/expensive and ultimately impossible.

The invention documented in this application uses an intelligent agent and a Process to solve these types of problems. The Process is implemented in various embodiments by a software agent that receives its objectives, rules, algorithms, environmental information, etc. from a data store. In solving relatively simple instantiations (low complexity, scale and volatility) of the problems outlined above a conventional data base or similar data store may be used. In addressing problems that are more complex, larger scale and with greater volatility an IF-MAP or other data store that has the capability to create and support an organically growing/evolving/changing schema, and provides a mechanism to propagate changes to the schema or data, but only as necessary will be required.

The above can be embodied three ways. It can be:
Fully distributed
Fully centralized
Hybrid distributed for local optimization and centralized for global optimization In the fully distributed embodiment, the agent called an Orchestrator is in each node and has a local data store either a data base or other conventional data store or an IF-MAP type instantiation. It Connects (etc.) with neighboring (Physical or logical neighbors) using whatever communication resource is available and completes the Process.

The internal structure of the Orchestrator is shown in the following figures describing the intercloud instantiation. The Task Management Entity (TME) containing the Task Access Point (TAP) is one Orchestrator and the Service Management Entity (SME) and the Service Access Point (SAP) is another Orchestrator. In the data integration embodiment the TME becomes the Data Source Entity (DSE) and the SME becomes the Data Integration Entity (DIE). Both the DSE and the DIE are instantiations of the Orchestrator.

In the fully centralized embodiment all agents for all participating components are located in a central server called a Conductor. Inside the Conductor the agents and their associated data store (either data base or IF-MAP) images interact using the internal communications mechanisms in the server. The Conductor converts the results of the interaction into instructions it sends to the remote components. All remote components send status information to the Conductor which is entered into the corresponding component image. The Conductor also contains a Simulator. The simulator allows what-if questions to be asked and answered to evaluate different possible courses of action.

In the hybrid solution, local optimization is performed as per the fully distributed embodiment. A portion of the information contained in the local data store (either data base or IF-MAP) contained in the Orchestrator is sent to the Conductor. The selection of the information sent to the Conductor is determined by the Filter. The reason for filtering is to reduce the amount of capacity consumed by the overhead of sending updates to the Conductor. The Conductor monitors global environment information not easily made available to the Orchestrators and combines that global information with the component images to develop instructions sent to the Orchestrators. These instructions can take the form of new rules, new objectives, or new algorithms. They may also involve creating new types of parameters in selected components that result in, through the Process, new Configurations.

Techniques to access cloud providers that preserve providers' ability to offer proprietary interfaces while increasing the ability of cloud-based service consumers to access services across providers is disclosed. The architecture disclosed herein can be applied in various embodiments to solve emerging problems in any portion of a computing/communication system. For embodiments discussed in detail below, we will focus by way of illustration and example on the following components: a "Task" which seeks to be performed by a "Service" in a "Cloud".

FIG. 1 illustrates an eight layer model of collaborative computing. In the example shown, the eight layer model 100 comprises stages of discovery 101, connection 102, description 103, negotiation 104, configuration 105, initiation 106, maintenance 107, and discontinuation 108. In discovery 101, two or more nodes, such as a Task and one or more Cloud-based Services, discover one another's existence, presence, and/or availability. In various embodiments, one or more mechanisms of discovery may be available and/or used. In connection 102, the nodes establish a connection that will enable them to communicate with one another. In some embodiments, a connection or other agent on each node facilitates establishment of the connection. In description 103, the nodes use the connection 102 to exchange meta-language based descriptions. In various embodiments, a Bridge creating an internal standard meta-language is used to enable nodes that may use different proprietary interfaces to understand each other's requirements, limitations, and capabilities. In negotiation 104, the nodes exchange meta-language based bids or proposals, for example proposed parameters, API's (Application Programming Interfaces) or other settings to be used to perform an operation comprising or otherwise associated with a Task and Service. A successful negotiation 104 results in a "contract", which in various embodiments may include a set of configuration or other parameters that the nodes have agreed through negotiation 104 to use to perform an operation comprising or otherwise associated with a Task supported by a Service. In configuration 105, the respective nodes configure themselves to perform the operation, e.g., as agreed in the negotiation 104. Once configured, the nodes enter initiation 106, in which the operation is initiated. In maintenance 107, the connection and operation are maintained, as needed, to ensure uninterrupted performance of the operation through to completion. In discontinuation 108, as and/or if needed the operation and connection are terminated, for example through graceful handover to another servicing node and/or cloud.

Definitions

The following definitions of terms used to describe various embodiments of applying the model of FIG. 1 in the context of cloud computing are provided.

Service: Because cloud computing is used to do so many different types of things such as Software As A Service (SAAS), Platform As A Service (PAAS), Infrastructure, Data Storage, and even the definition of what SAAS means have so much variability, what clouds do is abstracted as a "Service". For example, a Service provided by a Cloud may be to run an application.

Task: Similarly, a particular piece of work that a person or a legal entity would like a Cloud to do is abstracted as a "Task". For example, a Task might be an application that its owner desires to run on a Cloud.

Cloud: A Cloud is a service provider which uses cloud computing center(s) to provide a Service. A cloud computing center is generally connected to a network. In most cases the network is the Internet.

Meta Language: a vocabulary and grammar for representing and exchanging Meta Data.

Meta Data: Broadly, metadata describes a data or other entity. In various embodiments described herein, metadata is used to describe cloud computing or other nodes, to negotiate parameters to be used by two or more nodes to achieve completion of a Task, and to enter into a contract to achieve accomplishment of a Task as negotiated.

Contract: agreements between a Cloud and a Task about how, and under what conditions and configurations, a Task will be performed on a Cloud. This may include SLA's (Service Level Agreements).

Person: Includes natural people and legal entities.

Devices: Devices exist throughout, however for the purposes of this discussion of cloud computing, the term "Devices" is used to refer to sensors or actuators at the edges of networks that interface with the real world.

Information: Includes data in all its forms except Meta Data. This may include software. Information is owned by a Person and it may have Persons who are authorized users. Information may be held "in custody" for an owner, i.e., rightful possession without the right to use.

In various embodiments, typically a Task is owned by a Person. A Cloud is owned by a Person. A Person through a Task Management Entity (TME) contracts with a Person through a Service Management Entity (SME) for a Service. A Service on behalf of an associated Task may perform something for a third Person.

In various embodiments, a Device is owned by a Person. A Service on behalf of an associated Task may perform something for a Device.

In various embodiments, Information is owned by a Person. The owner of the Information may also be the Owner of a Task and/or a Cloud. Information may be generated by a Device. If so, it may be owned by the Device's owner or by a third party. A Person may allow a Task or a Service to use the Information it owns.

End User: a human being or a Device which is the final consumer of Information developed/delivered by Task in a Cloud.

Infrastructure View

Inter Cloud Communication

This might involve an application in one Cloud accessing data structures in one or more other Clouds. In order to do so, it might be necessary to search the landscape of Clouds to find out which ones have relevant data structures and determine not only how to access them, but how the different data structures might inter-relate. An example might be an application in one Cloud that seeks to provide a specific result by combining and processing census data from many different countries contained in different data structures in different Clouds.

Movement of Application from One Cloud to Another Cloud

This might involve a decision by a user to move an application developed to operate in the SalesForce.com Cloud for QoS or cost reasons to want to move their application to Amazon's Cloud.

Passing Credentials from One Cloud to Another Cloud

This might involve passing an end user who has been authenticated by one Cloud to another Cloud with an assurance that the user has been authenticated.

Movement, Dramatic Reconfiguration, or Merger of Clouds

This Use Case involves the dynamic properties of Clouds to change in perhaps very significant ways. This changeability yields a requirement to track the status of Clouds.

Model Representations

The model assumes that the End User view is the operative force, while the focus is on the infrastructure view. This is done to lower the complexity of each representation, thus making the model easier to understand.

There are two representations of this model. One is a series of diagrams and the other is a layered model. The diagrams give a good holistic view of the architecture while the layered model gives a concise representation that is analogous to representations of previous approaches. We will start with the diagrammatic model and then move to the layered model.

Diagrammatic Model

Figure 2A:
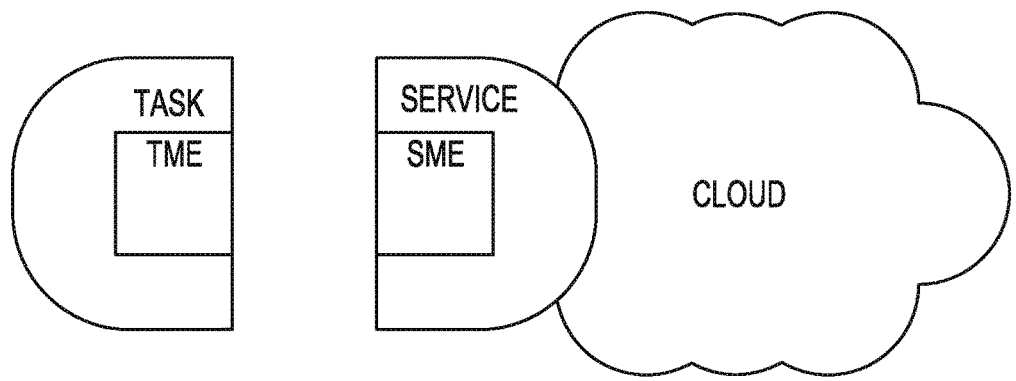
FIG. 2A illustrates a Task and a Cloud-based Service in three states.
Figure 2A:
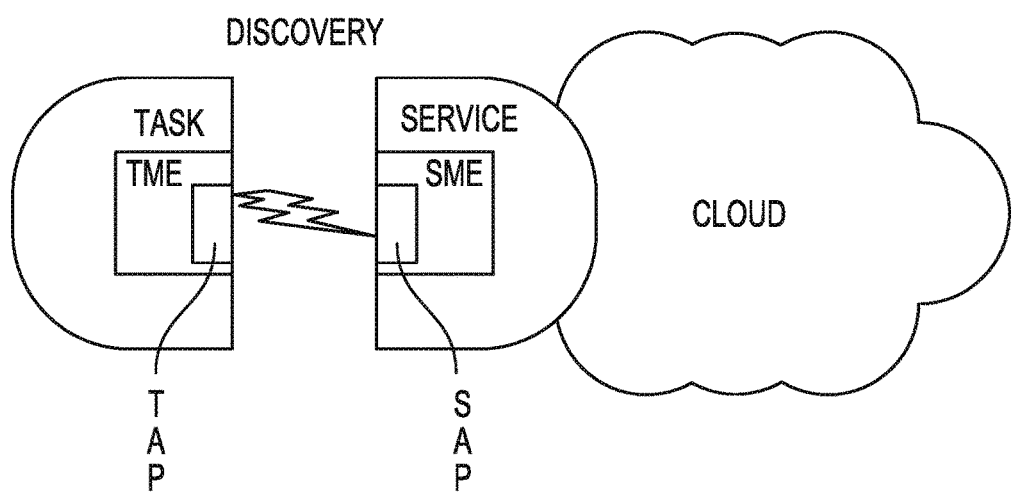
Figure 2A:
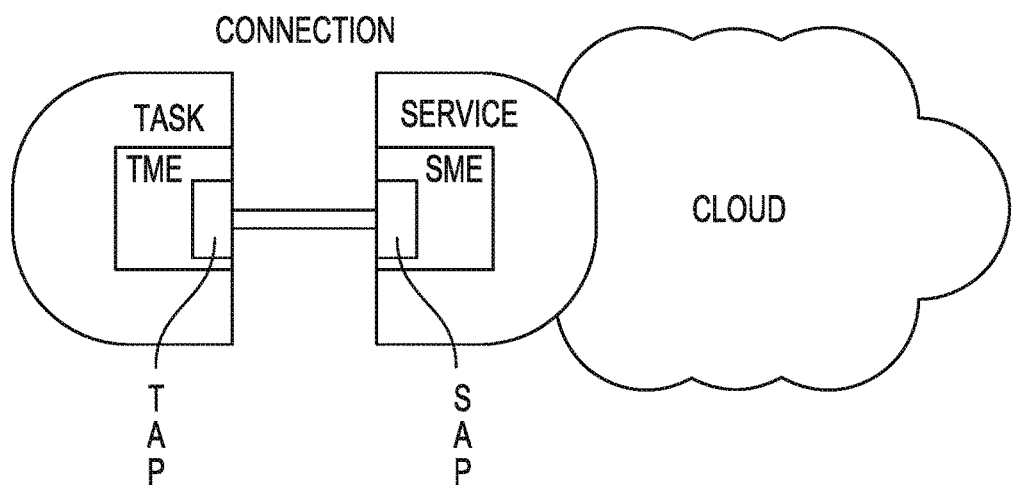

In the diagrammatic model we will use some additional entities. These may be automated, manual or a hybrid of the two:

TME=Task Management Entity
TAP=Task Access Point
SME=Service Management Entity
SAP=Service Access Point FIG. 2A illustrates a Task and a Cloud-based Service in three states. In a first state, shown at the top, there is a Task and a Cloud. The Task has a TME and the Cloud has a SME. The Task and the Cloud are peers. They are not a client and a server. At this point, they may not know about each other. In a second state, shown in the middle of FIG. 2A, the Task and Cloud Discover each other. In the example shown, the TME has a TAP, and the SME has a SAP. Through some Discovery mechanism they Discover each other's basic Description. This mechanism can be a Peer to Peer protocol such as "Calling All Clouds" or "Calling All Tasks" or it can be mediated by a third party. In a third state, shown at the bottom of FIG. 2A, the TAP and SAP establish a Connection between them. This connection can be totally through a network, or via a conversation between two people.

Figure 2B:
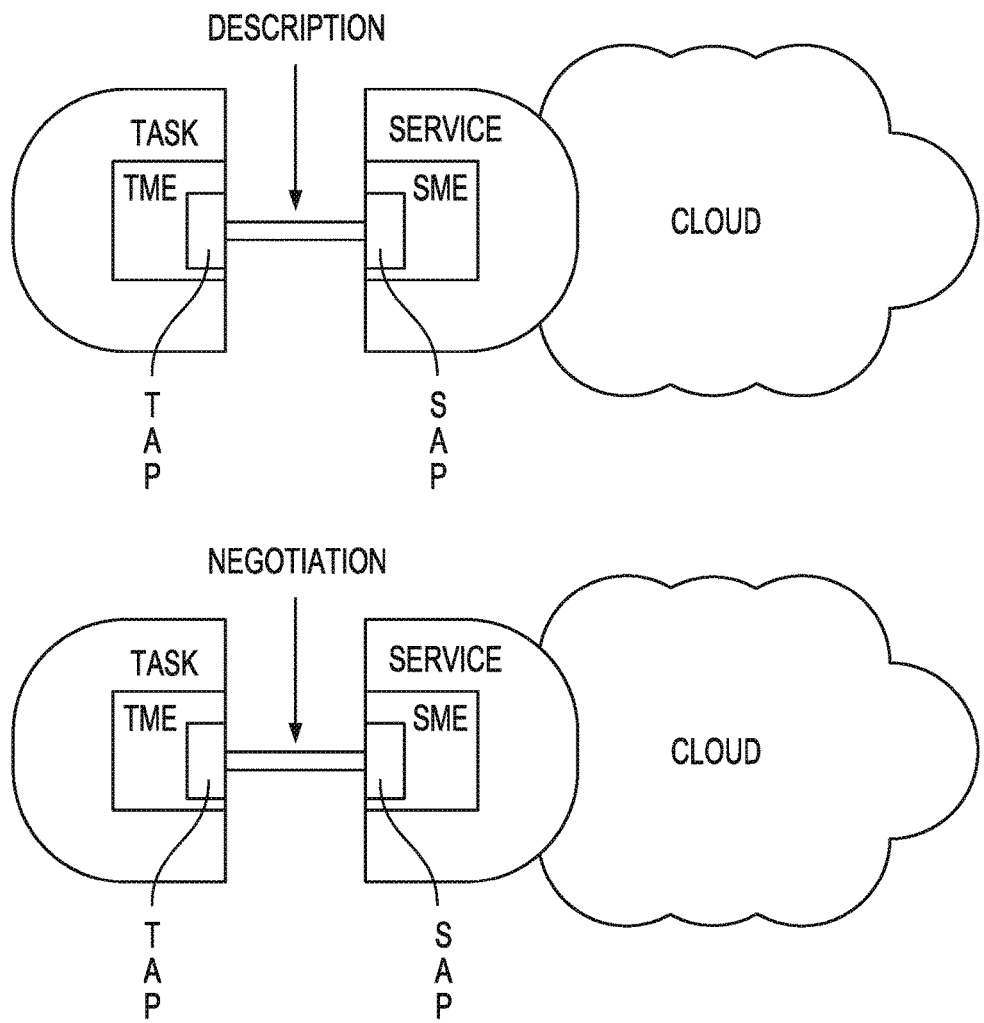
FIG. 2B illustrates a Task and a Cloud-based Service in description and negotiation states.

FIG. 2B illustrates a Task and a Cloud-based Service in description and negotiation states. In the example shown, the TME and the SME through their respective TAP and SAP exchange Descriptions and begin to negotiate. This Negotiation is accomplished through the exchange of Meta Data. It results in a Contract.

Figure 2C:
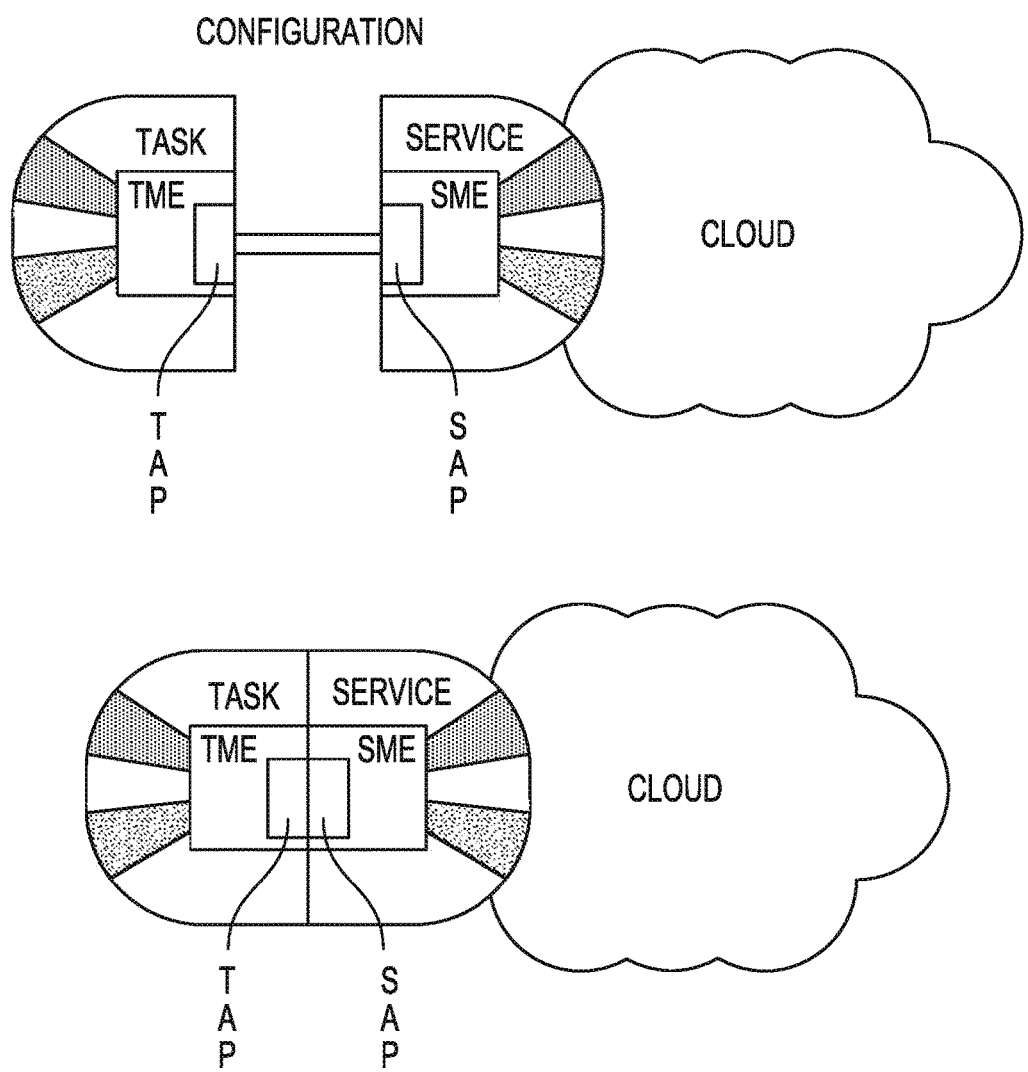
FIG. 2C illustrates a Task and a Cloud-based Service in initiation, configuration, and maintenance states.

FIG. 2C illustrates a Task and a Cloud-based Service in initiation, configuration, and maintenance states. In the example shown, the TME Configures the Task and the SME Configures the Cloud in accordance with the Contract in such a way that the Cloud can perform the Task. In the state shown at the bottom of FIG. 2C, the Performance of the Task is Initiated and Maintained by the Cloud. While the figure shows the Task and the Cloud attached to each other, this representation is only to indicate that the Task has been virtually bound to the Cloud. Depending on the nature of the Task, Initiation may involve critical timing and coordination such as sync point processing. Time granularity may range from days to very small fractions of a second.

After the Task has been Initiated on the Cloud, the Cloud may change. These changes may be due to normal operation, technology upgrades, physical moves, ownership changes, etc. The Task may undergo similar modifications. Therefore, the TME and the SME need to continuously monitor each other and as necessary go back to Negotiation and Configuration stages. Because of the explosive growth in mobile systems, special attention needs to be given to aspects of mobility.

Figure 2D:
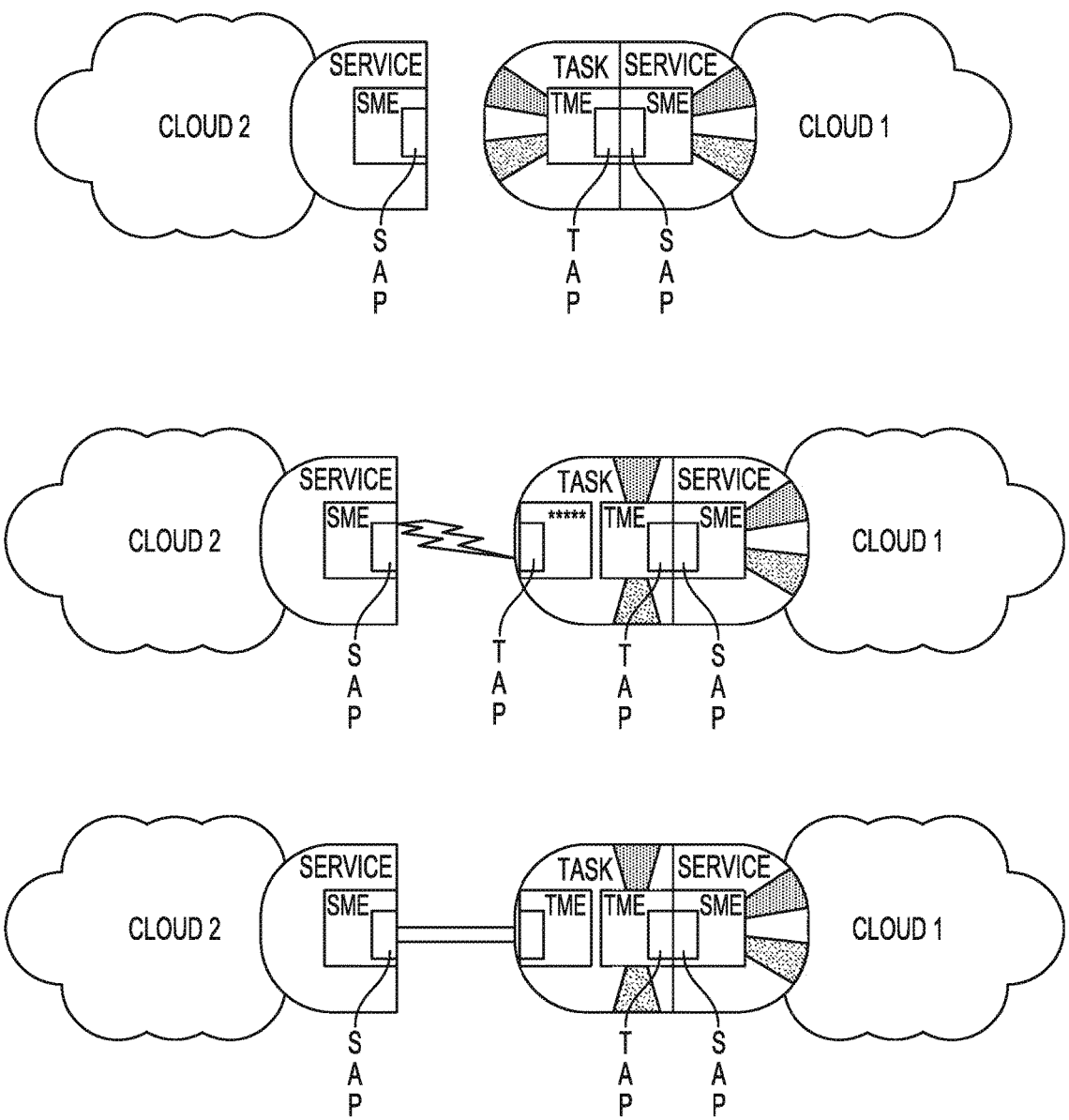
FIG. 2D illustrates a Task and a Cloud-based Service in initial stages of a transition between two Clouds.

FIG. 2D illustrates a Task and a Cloud-based Service in initial stages of a transition between two Clouds. In the example shown, the Task while bound to a Service associated with Cloud 1 becomes aware of a change that prompts the Task to begin a process of transition to being instead bound to a Service associated with Cloud 2. In the drawing at the top of FIG. 2D, the second Service and Cloud 2 are present but have not yet engaged with or been engaged by the Task. In the drawing in the middle, the Task and the Service associated with Cloud 2 Discover each other. In order for the Task to continue operating on Cloud 1 while it Discovers Cloud 2, in some embodiments it creates another instantiation of its TME/TAP. In the drawing at bottom, the above-described processes of Connection, Negotiation, and entering into a Contract are illustrated.

Figure 2E:
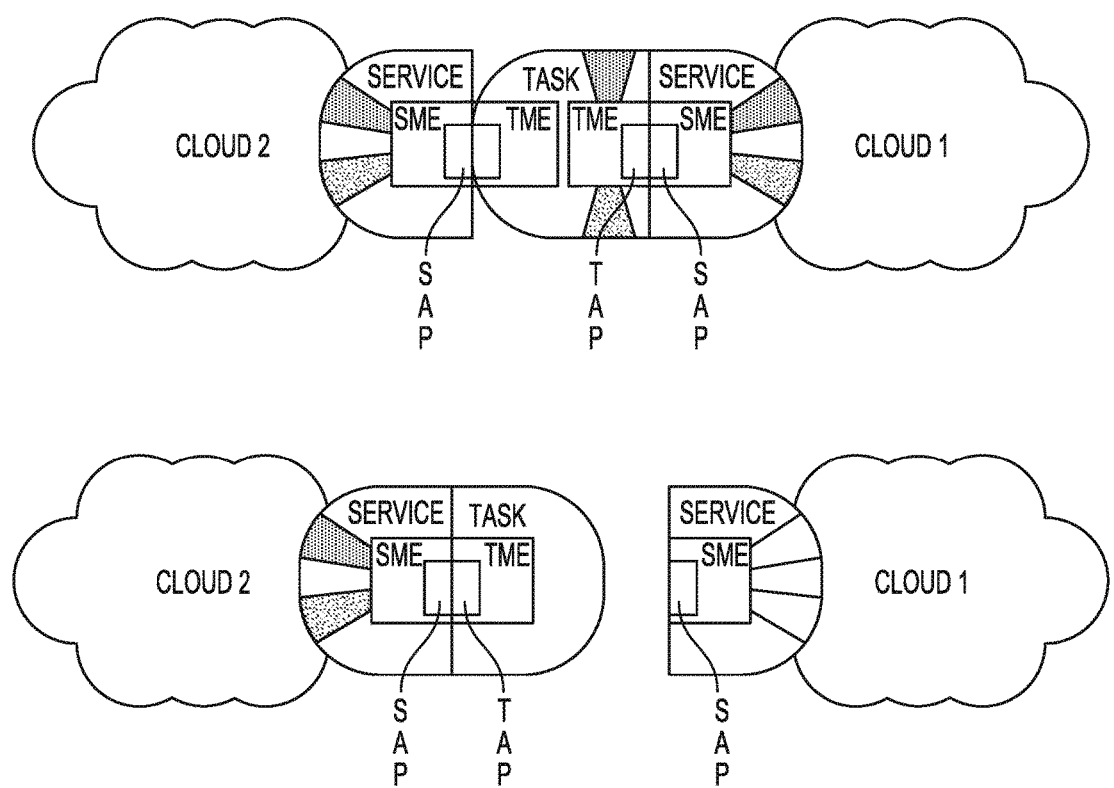
FIG. 2E illustrates a Task performing the final stages of a transition between two Clouds.

FIG. 2E illustrates a Task performing the final stages of a transition between two Clouds. In the example shown, the upper drawing illustrates the initiation of operation by the second Service, associated with Cloud 2, in fulfillment of a Contract negotiated as described above. In the lower drawing, Termination of the connection with the first Service associated with Cloud 1 is illustrated, while performance of the second Service associated with Cloud 2 is maintained. In some embodiments, at Initiation on Cloud 2 in addition to all the aspects described above for initiation with respect to Cloud 1, the Task must reconfigure itself for Cloud 2. The diagram at the bottom of FIG. 2E shows a ghost of the Configuration for the Task remaining on Cloud 1. The ghost remains in some embodiments to facilitate fallback if a problem is encountered in Initiation or subsequently on Cloud 2. In various embodiments, the ghost of the Configuration for the Task ("Task ghost") remains on Cloud 1 for disaster recovery, other similar back-up, or other reasons. This Task ghost is governed by the Contract between the Task and Cloud 1 or by a contract between Cloud 1 and Cloud 2.

Figure 2F:
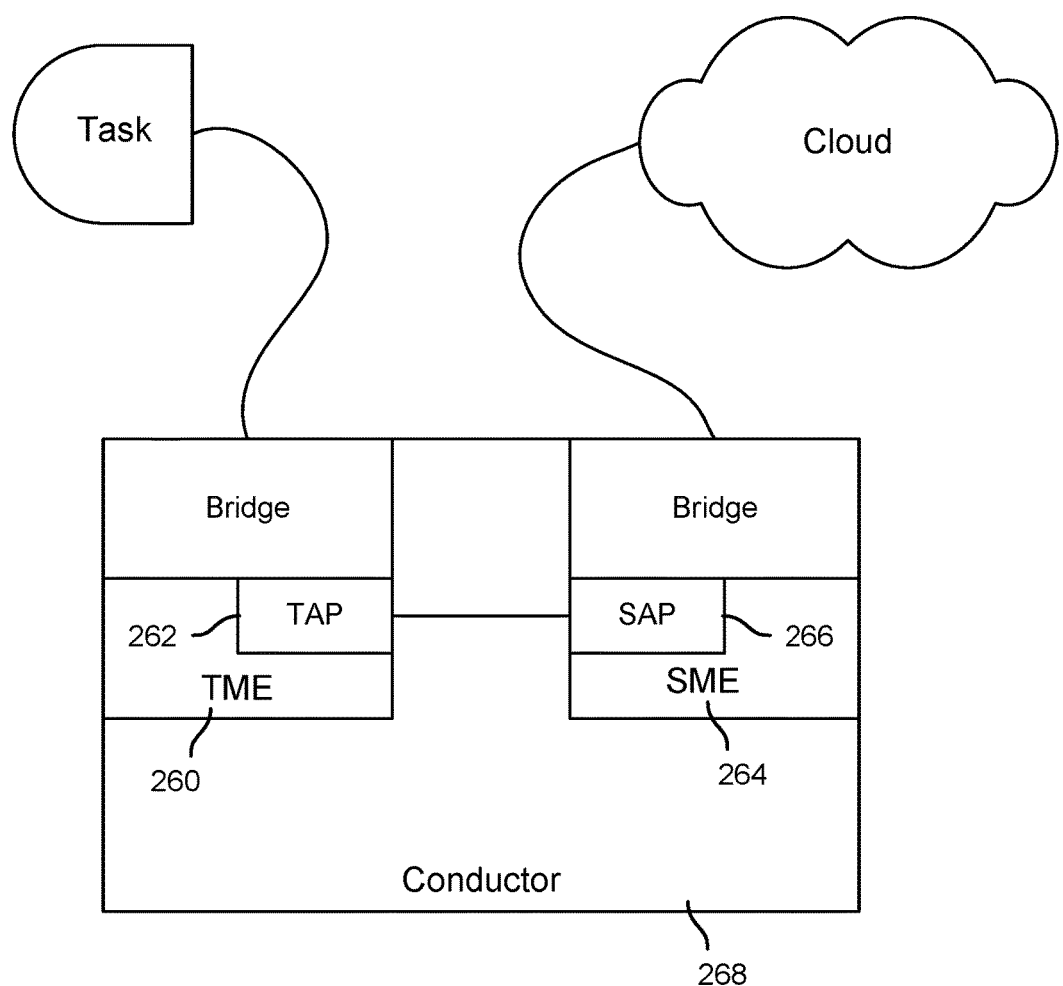
FIG. 2F illustrates the fully centralized embodiment.

FIGS. 2A through 2E and the accompanying text illustrate some of the fully distributed embodiments. FIG. 2F illustrates the fully centralized embodiment. In this embodiment the TME 260/TAP 262 and SME 264/SAP 266 are contained as images in a centralized Conductor 268. Because of the scale of the cloud computing marketplace and its API complexity, it is likely that only a data store that has the capability to create and support an organically changing schema, and provides a mechanism to propagate changes to the schema or data, but only as necessary such as IF-MAP will be required to support the various TME's and SME's. Because of the variety of interfaces deployed a bridge may be needed to interface between each specific type of TME and its class of Tasks and each type of SME and its class of Services.

Figure 2G:
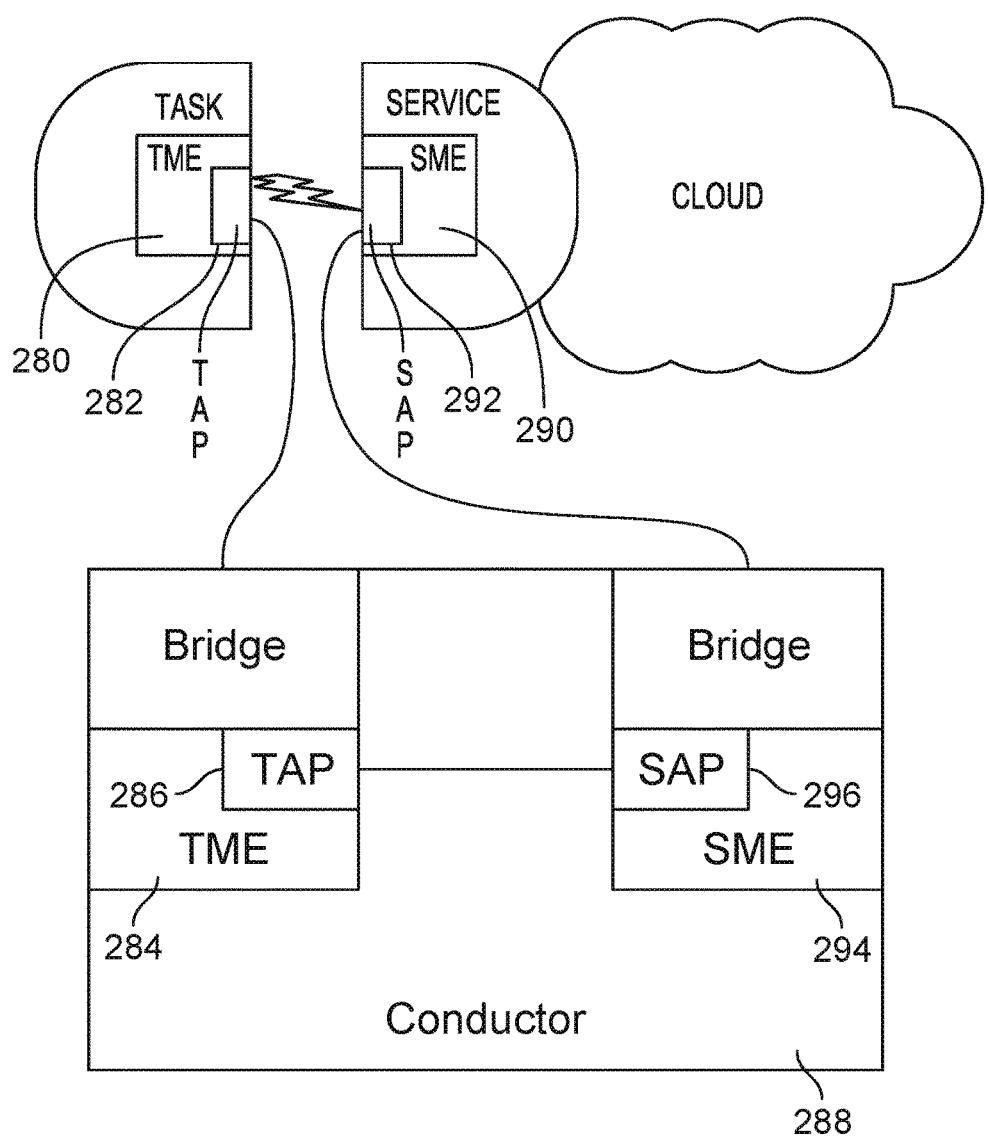
FIG. 2G illustrates some of the hybrid embodiments.

FIG. 2G illustrates some of the hybrid embodiments. It shows a TME 280/TAP 282 in the Task (acting as an Orchestrator) and a TME 284/TAP 286 in the Conductor 286. Similarly, it shows a SME 290/SAP 292 in the Service (acting as an Orchestrator) and a SME 294/SAP 296 in the Conductor 288. In the hybrid case the images in the Conductor may be at a variety of stages of completeness depending on the distribution of function between the distributed and centralized components. One possible distribution of function is for the Conductor to perform Discovery and Connection; then for all other layers to be implemented in the distributed SME's and TME's. Other distributions of function are also possible.

Below, each of the eight states or layers shown in FIG. 1 is described and its requirements for Security, Management and Meta Language in various embodiments outlined. Management is included because without attention to management, security in its broadest sense including reliability, robustness, etc. cannot be assured in some embodiments. Meta Language (Meta Language is the language that is used to represent and exchange Meta Data.) is included because it is central in some embodiments to the concept. Security is used in its broadest possible meaning to include all aspects of information and operations integrity. For this discussion, security can be broken down into three aspects: 1.) that required by the nature of the Task 2.) that concerned with preventing proprietary, private, or secret information owned by one Person leaking from a Task owned by that Person to a competitor with another Task in the same Cloud and 3.) that involved in the binding of Tasks to Clouds. By their very nature, different Tasks have different security requirements. Some are very stringent and are difficult to fully meet on today's internet. Similarly, preventing leakage of information between Tasks in a Cloud can be of key concern and addressing these concerns could be critical to the future growth of cloud computing. The Third set of security requirements, that is those requirements that must be met for the binding of Tasks to Clouds, is what is considered below.

Discovery—in various embodiments, Discovery may involve discovering a specific Cloud's neighbors (both physical and virtual) or discovering which other Cloud has the data structure needed for a particular application, etc. This layer is concerned with mechanisms for accomplishing the identification of "potentially interesting Clouds". Similarly Clouds may be looking for Tasks and this layer is concerned with mechanisms for Clouds to identify potentially interesting Tasks.

Security Requirement:
Identity assurance
Management Requirement
Maintain local list of virtual neighbors?
Meta Language Requirement
Make oneself observable, either by responding to peer to peer messages or through a third party Connection—once an interesting Cloud has been discovered, a basic connection to that Cloud must be established. This channel must be sufficient to carry the description information and negotiation process.

Security Requirement
Identity assurance
Denial of Service protection
Management Requirement
Maintain QoS on connection
Meta Language Requirement
Verify connection Description—Meta Data that allows one Cloud to understand the communication, processing I/O, API, data structure, data content, etc. of a Task and vice versa. This may require a standard Meta Language that is understood by both.

Security Requirement
Accuracy of description—truthfulness
Accuracy of Description—timeliness
Accuracy of Description—identity
Accuracy of Description—not changed in transit
Privacy
Management Requirement
Timeliness
Meta Language Requirement
Usefulness of Description/Contract
Simplicity of Description/Contract
Completeness of Description/Contract Negotiation—starts with the exchange of Meta Language descriptions of each other and then proceeds to a bid and bind process of negotiating how the two will interact. This may involve agreements on what information in what formats and structures will be exchanged, or how an application must be modified from a form that runs in one Cloud in order to run in another Cloud, or how credentials will be passed, or how interactions will change as the nature of the Clouds change.

Security Requirement
Protection of identity
Protection of meta data in transit
Management Requirement
Commitment only to what can be fulfilled
Meta Language Requirement
Expressiveness of Meta Language sufficient
Simplicity of Meta Language sufficient Configuration—Once the Task and the Cloud have agreed how they will interact, each needs to configure itself (such as an interface processes, data structures, etc.).

Security Requirement
Assurance that intended configuration will not create unintended security exposures
Management Requirement
Assurance that intended configuration will not create unintended operational exposures/reductions in QoS/failures
Meta Language Requirement
Expressiveness of meta data sufficient—ease of converting Contract into required configuration/reconfiguration
Simplicity of meta data sufficient Initiation of Operation—the interacting Task and Cloud must signal their completion of all Configuration tasks and readiness to start the interaction. Then they must start the interaction process at a set time. This time may be synchronous if the negotiation process has specified synchronicity.

Security Requirement
Assurance that Configuration Security requirements have been met
Management Requirement
Initiation between interacting clouds in sync
Meta Language Requirement
Expressiveness of Meta Language sufficient
Simplicity of Meta Language sufficient Maintenance of Operation—once operation has commenced, it is necessary to monitor changes in the environment and in the interacting Task and Cloud to make any necessary adjustments to assure adequate on-going operation.

Security Requirement
Ongoing protection of identity
Management Requirement
Track changes in all interacting Clouds in Description and Configuration
Meta Language Requirement
Expressiveness of Meta Language sufficient
Simplicity of Meta Language sufficient Discontinuation of Operation—In the Negotiation layer, conditions for ending the interaction between the Task and the Cloud has been agreed. This layer involves the invocation of those and the end of the interaction. This end may be synchronous if that has been agreed in the Negotiation process.

Security Requirement

Assurance that the conditions for Discontinuation have been met

Management Requirement

Maintain timeliness

Meta Language Requirement

Expressiveness of Meta Language sufficient

Simplicity of Meta Language sufficient

While the eight states or layers shown in FIG. 1 are described above each with reference to and its corresponding requirements for Security, Management and Meta Language in various embodiments, in other embodiments one or more of the layers may be implemented and/or employed differently, and in some embodiment the requirements for Security, Management and Meta Language may differ than those described above.

Medical Records Example

The previous set of figures (FIGS. 1 to 3) and their related discussions represent the process in data integration with a slight relabeling. In the data integration embodiment the Task Management Entity (TME) becomes the Data Source Entity (DSE) containing the Data Access Point (DAP) and the Service Management Entity (SME) becomes the Data Integration Entity (DIE) containing the Integration Access Point (IAP). For ease of reading, the whole set of figures and related text is not repeated here, but is included by reference in front of the following text.

Figure 3A:
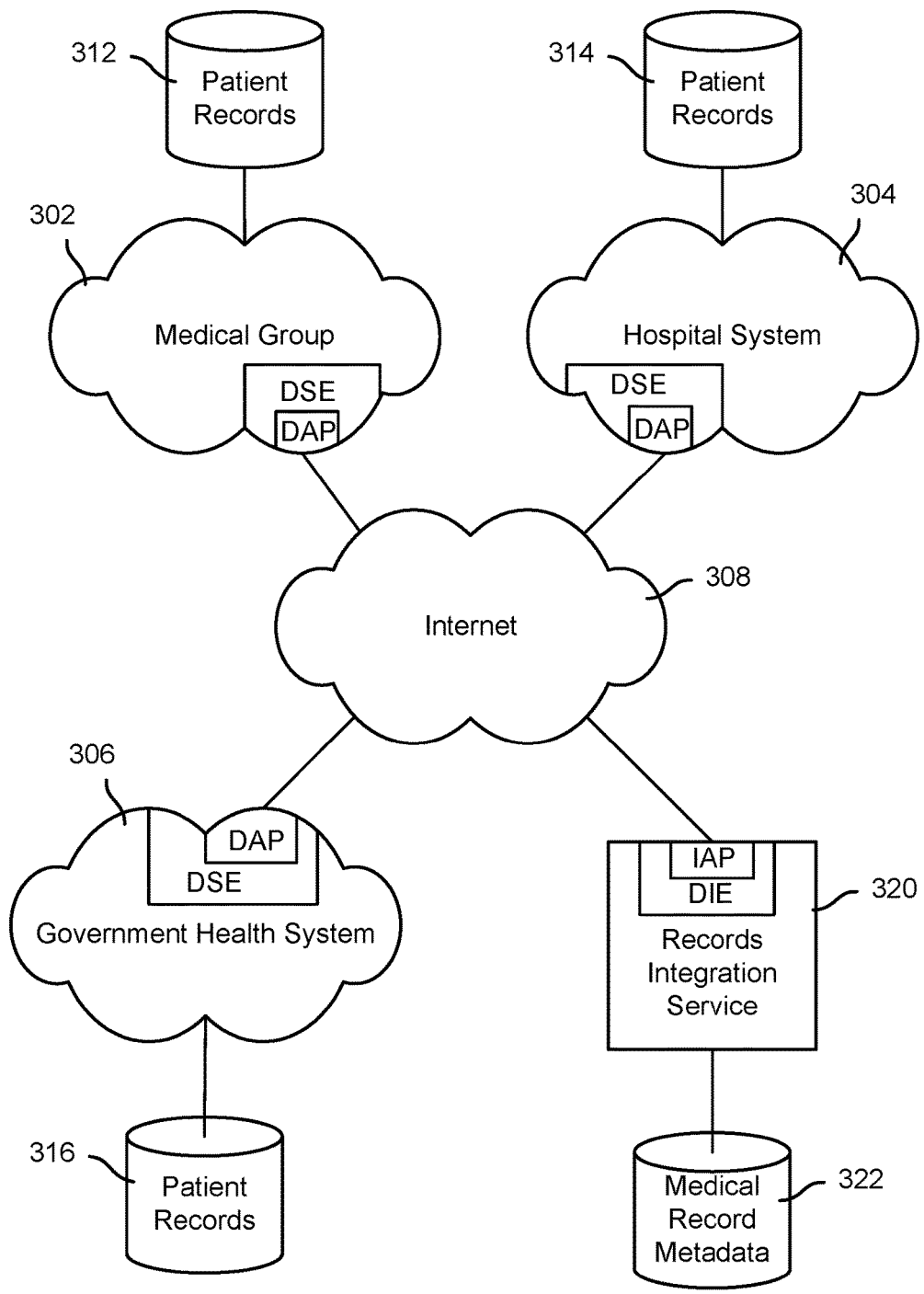
FIG. 3A is a block diagram illustrating an embodiment of an electronic medical records management system.

FIG. 3A is a block diagram illustrating an embodiment of an electronic medical records management system. In the example shown, separate medical records domains 302, 304, and 306 are connected via DSE's and DAP's to the Internet 308 or some other network. In some cases specialized networks not connected to the generally available internet are used. Each domain maintains for each patient one or more associated electronic medical records, represented in FIG. 3 by patient records 312, 314, and 316, respectively. In each domain, a different and potentially proprietary format and access interface may be used to maintain patient records. There are a number of standards in this area today. Some system developers and providers use some of the standards. Others use others. Some use only parts of one or none at all. Furthermore, inside each standard there are many ways of representing the same data. In addition, typically in the past security, privacy, and regulatory concerns have caused medical providers to be unwilling and/or unable to provide access to patient medical records across domains. In the example shown in FIG. 3, a records management service 320 accesses the various provider domains 302, 304, and 306 via the Internet 308 or some other network. In some cases specialized networks not connected to the generally available internet are used. A medical record metadata store 322 in which the format of and/or interfaces to access medical records in the respective domains 302, 304, and 306 is provided via a DIE and IAP. In some embodiments, each provider and/or a third party describes in a standard meta-language the records and associated access interfaces for electronic medical records as maintained by that provider. In other embodiments, a bridge is developed to provide both the data and the metadata from a particular source in a way that can be used. When a health care professional, administrator, regulator, insurer, etc. desires to access a patient's information across electronic record domains, in some embodiments the interested party queries the records management service 320. In some embodiments, a process of discovery, connection, description, and negotiation as described above is used to locate the patient's records in one or more domains and arrive at an understanding ("contract") regarding how an operation to transfer or otherwise make the record available will be performed. Contracting nodes configure themselves, as described herein, and initiate and maintain an operation to transfer or otherwise make available relevant records, through to discontinuation (if applicable), as described above.

In some embodiments, medical record metadata 322 is built by the record holding domains themselves. For example, an IF-MAP or similar data store is used in some embodiments. IF-MAP enables a record holder to describe its own records and interfaces, and to update them over time. Other entities, such as records management service 320 and/or other record keeping domains, may subscribe to be notified of changes in a record holder's data, for example when a mutual patient's record is updated in connection with an office visit, receipt of lab results, etc.

Figure 3B:
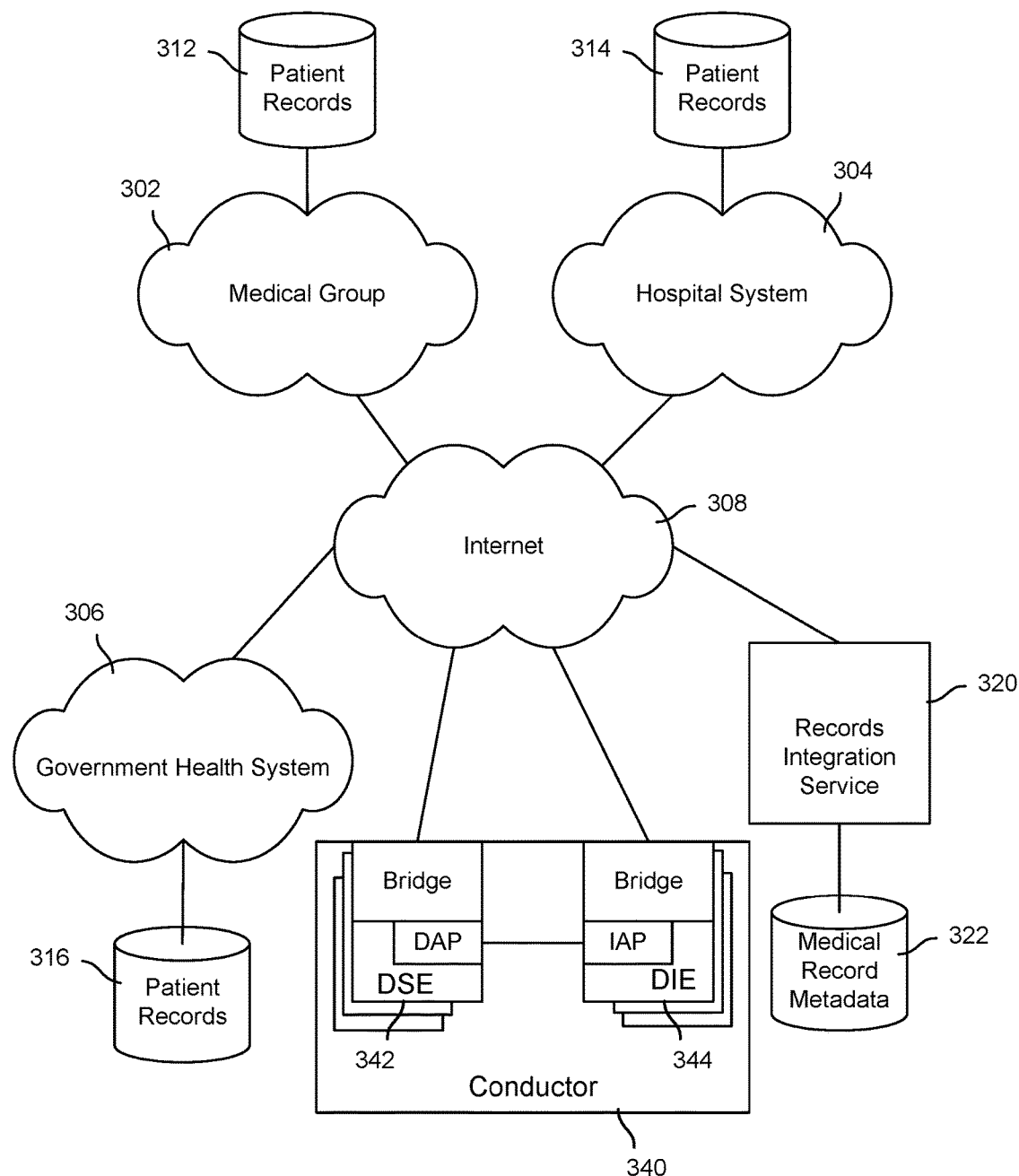
FIG. 3B illustrates some of the fully centralized embodiments.

FIG. 3B illustrates some of the fully centralized embodiments. The conductor 340 contains multiple DSE/DAP 342 and DIE/IAP 344 and associated images one for each of the types of record sources and record integration components.

In some embodiments, the DIE supported by the Conductor/Orchestrator in addition to aggregating single patient information may provide aggregate class information. In some cases the class information may be anonymized to protect the privacy of individual patients. For example, a DIE may seek to aggregate all patients in a given country, over a given time interval, who have suffered head trauma as a result of auto accidents. In such, the requirement to protect individual privacy may be to ensure that only class data is available, and that there is no way to discover the identity of the individuals in the class.

Figure 3C:
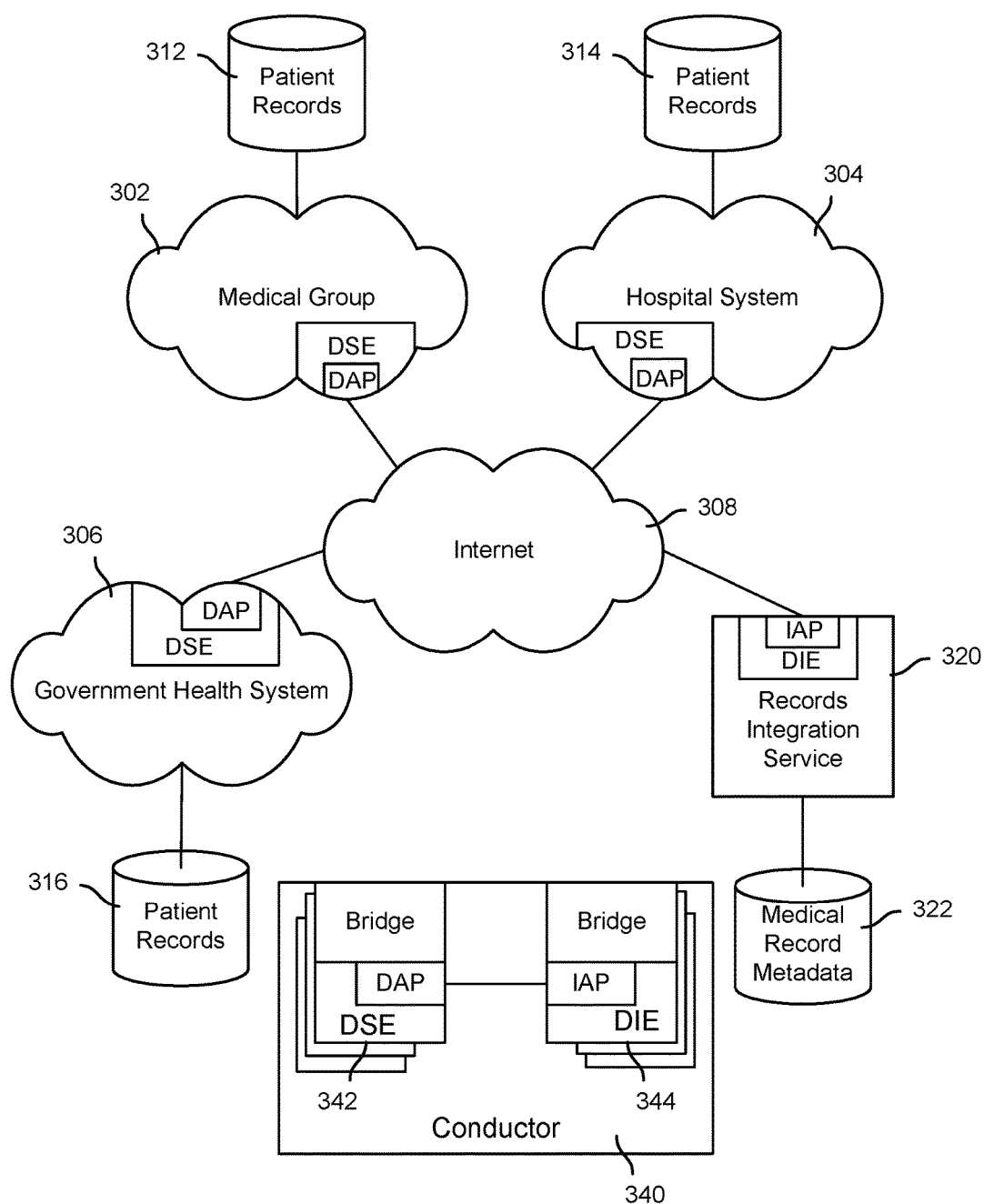
FIG. 3C illustrates some of the hybrid embodiments.

FIG. 3C illustrates some of the hybrid embodiments. It shows a DSE/DAP in both the source data stores (acting as an Orchestrator) and in the Conductor. Similarly, it shows a DIE/IAP in both the integration service (acting as an Orchestrator) and the Conductor. In the hybrid case the images in the Conductor may be at a variety of stages of completeness depending on the distribution of function between the distributed and centralized components. One possible distribution of function is for the Conductor to perform Discovery and Connection; then for all other layers to be implemented in the distributed orchestrators. Other distributions of function are also possible.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of computing, comprising:
    storing in a data store for each of a plurality of entities an entity image data comprising metadata about an entity of the plurality of entities, wherein the data store is configured to create and support an organically changing schema, and provides a mechanism to propagate changes to the schema or data;
    discovering, using a processor of a first entity, a second entity to help achieve an objective, wherein the second entity is a cloud-based entity;
    connecting to a processor of the second entity via a communication interface device;
    using a meta-language to exchange with the processor of the second entity via the communication interface a description of the objective to aggregate data from the second entity and descriptive information associated with the second entity, wherein the descriptive information includes an identification of a proprietary data access interface associated with the second entity, wherein the proprietary data access interface associated with the second entity is different than a proprietary data access interface associated with the first entity, wherein a bridge separate from the processor of the first entity and the processor of the second entity is configured to receive the meta-language exchanged with the processor of the second entity and to use an internal standard meta-language to enable the processor of the second entity with the proprietary data access interface to understand the description of the objective;

negotiating with the processor of the second entity using the meta-language, including by exchanging one or more proposals with the processor of the second entity via the communication interface to form a contract, the contract indicates how data will be aggregated from the second entity;

receiving an indication of a need to recruit a third entity to help achieve the objective;

recruiting the third entity to help achieve the objective, through a process that includes one or more of the following: discovery, connection, description, negotiation, configuration, initiation of operation, maintenance of operation, and discontinuation of operation; and in the event the contract is formed, performing a self-configuration in accordance with the contract.

2. The method of claim 1, further comprising initiating an operation in accordance with the contract.

3. The method of claim 2, further comprising maintaining the operation in accordance with the contract.

4. The method of claim 3, further comprising discontinuing the operation in accordance with the contract.

5. The method of claim 1, wherein the second entity comprises one or more of the following: a cloud service, a cloud task, a cloud, and a cloud computing device associated with an end user.

6. The method of claim 1, further comprising negotiating with the third entity a contract to replace the second entity in helping to achieve the objective.

7. The method of claim 6, wherein the second entity maintains, after termination of an operation associated with helping to achieve the objective, a vestige of a configuration used to help achieve the objective.

8. The method of claim 7, wherein the second entity uses the vestige, if needed, to resume helping to achieve the objective.

9. The method of claim 1, wherein the first entity comprises one or more of the following: an electronic record, an electronic patient record, an electronic record system, and an electronic record device associated with an end user.

10. The method of claim 1, wherein aggregating data comprises aggregating from a plurality of electronic records stores a plurality of records associated with an individual patient.

11. The method of claim 1, wherein aggregating data comprises aggregating from a plurality of electronic records stores a plurality of records associated with a class of patients.

12. The method of claim 11, further comprising anonymizing the records to protect the identity of individual patients in the class.

13. The method of claim 1, wherein the contract includes at least one of the following parameters to be used in the aggregation of data: configurations, settings, and data formats and structures.

14. A system, comprising:
a communication interface device; and
a processor of a first entity configured to:
store in a data store for each of a plurality of entities an entity image data comprising metadata about an entity of the plurality of entities, wherein the data store is configured to create and support an organically changing schema, and provides a mechanism to propagate changes to the schema or data;

discover a second entity to help achieve an objective, wherein the second entity is a cloud-based entity;

connect to a processor of the second entity via the communication interface device;

use a meta-language to exchange with the second processor of the second entity via the communication interface a description of the objective to aggregate data from the second entity and descriptive information associated with the second entity, wherein the descriptive information includes an identification of a proprietary data access interface associated with the second entity, wherein the proprietary data access interface associated with the second entity is different than a proprietary data access interface associated with the first entity, wherein a bridge separate from the processor of the first entity and the processor of the second entity is configured to receive the meta-language exchanged with the processor of the second entity and to use an internal standard meta-language to enable the processor of the second entity with the proprietary data access interface to understand the description of the objective;

negotiate with the second entity using the meta-language, including by exchanging one or more proposals with the processor of the entity via the communication interface to form a contract, the contract indicates how data will be aggregated from the second entity;

receive an indication of a need to recruit a third entity to help achieve the objective;

recruit the third entity to help achieve the objective, through a process that includes one or more of the following: discovery, connection, description, negotiation, configuration, initiation of operation, maintenance of operation, and discontinuation of operation; and in the event the contract is formed, perform a self-configuration in accordance with the contract; and a memory coupled with the processor, wherein the memory is configured to provide the processor with instructions.

15. The system of claim 14, wherein the second entity comprises one or more of the following: a cloud service, a cloud task, a cloud, and a cloud computing device associated with an end user.

16. The system of claim 14, wherein the processor is further configured to negotiate with the third entity a contract to replace the second entity in helping to achieve the objective.

17. The system of claim 14, wherein the second entity maintains, after termination of an operation associated with helping to achieve the objective, a ghost or other vestige of a configuration used to help achieve the objective.

18. The system of claim 14, wherein the second entity comprises one or more of the following: an electronic record, an electronic patient record, an electronic record system, and an electronic record device associated with an end user.

19. The system of claim 14, wherein the contract includes at least one of the following parameters to be used in the aggregation of data: configurations, settings, and data formats and structures.

20. A computer program product embodied on a tangible, non-transitory computer readable storage medium and comprising computer instructions for:
   storing in a data store for each of a plurality of entities an entity image data comprising metadata about an entity of the plurality of entities, wherein the data store is configured to create and support an organically changing schema, and provides a mechanism to propagate changes to the schema or data;
   discovering a second entity to help a first entity achieve an objective, wherein the second entity is a cloud-based entity;
   connecting to a processor of the second entity;
   using a meta-language to exchange with the processor of the second entity via the communication interface a description of the objective to aggregate data from the second entity and descriptive information associated with the second entity, wherein the descriptive information includes an identification of a proprietary data access interface associated with the second entity, wherein the proprietary data access interface associated with the second entity is different than a proprietary data access interface associated with the first entity, wherein a bridge separate from the processor of the first entity and the processor of the second entity is configured to receive the meta-language exchanged with the processor of the second entity and to use an internal standard meta-language to enable the second entity with the proprietary data access interface to understand the description of the objective; and
   negotiating with the processor of the second entity using the meta-language, including by exchanging one or more proposals with the processor of the second entity via the communication interface to form a contract, the contract indicates how data will be aggregated from the second entity;
   receiving an indication of a need to recruit a third entity to help achieve the objective;
   recruiting the third entity to help achieve the objective, through a process that includes one or more of the following: discovery, connection, description, negotiation, configuration, initiation of operation, maintenance of operation, and discontinuation of operation; and
   in the event the contract is formed, performing a self-configuration in accordance with the contract.

21. The computer program product of claim 20, further comprising computer instructions for initiating an operation in accordance with the contract.

22. The computer program product of claim 21, further comprising computer instructions for maintaining the operation in accordance with the contract.

23. The computer program product of claim 22, further comprising computer instructions for discontinuing the operation in accordance with the contract.

24. The computer program product of claim 20, wherein the contract includes at least one of the following parameters to be used in the aggregation of data: configurations, settings, and data formats and structures.

* * * * *